United States Patent
Iwakoke et al.

(10) Patent No.: US 11,862,431 B2
(45) Date of Patent: Jan. 2, 2024

(54) PLASMA CONTROL SYSTEM AND PLASMA CONTROL PROGRAM

(71) Applicant: NISSIN ELECTRIC CO., LTD., Kyoto (JP)

(72) Inventors: Tsubasa Iwakoke, Kyoto (JP); Shigeaki Kishida, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 234 days.

(21) Appl. No.: 17/625,775

(22) PCT Filed: Jul. 10, 2020

(86) PCT No.: PCT/JP2020/026951
§ 371 (c)(1),
(2) Date: Jan. 10, 2022

(87) PCT Pub. No.: WO2021/010302
PCT Pub. Date: Jan. 21, 2021

(65) Prior Publication Data
US 2022/0277930 A1 Sep. 1, 2022

(30) Foreign Application Priority Data
Jul. 12, 2019 (JP) .................. 2019-130261

(51) Int. Cl.
*H01J 37/32* (2006.01)
*H05H 1/46* (2006.01)

(52) U.S. Cl.
CPC ..... *H01J 37/3211* (2013.01); *H01J 37/32174* (2013.01); *H05H 1/4652* (2021.05)

(58) Field of Classification Search
CPC ............... H01J 37/321; H01J 37/3211; H01J 37/32174; H05H 1/46; H05H 1/4645; H05H 1/4652
(Continued)

(56) References Cited

U.S. PATENT DOCUMENTS 6,036,878 A * 3/2000 Collins ............. H01J 37/32458
216/68
2010/0095888 A1* 4/2010 Mori ................... C23C 16/509
315/111.21
(Continued)

FOREIGN PATENT DOCUMENTS

JP 2004228354 8/2004
JP 2010238981 10/2010
(Continued)

OTHER PUBLICATIONS

Office Action of Taiwan Counterpart Application, with English translation thereof, dated Aug. 11, 2021, pp. 1-16.
(Continued)

*Primary Examiner* — William Hernandez
(74) *Attorney, Agent, or Firm* — JCIPRNET

(57) ABSTRACT

The present invention comprises: a high-frequency power supply; an antenna group having a plurality of antennas connected to the high-frequency power supply; a plurality of reactance variable elements connected to the feeding sides and the grounding sides of the plurality of antennas; a current detection mechanism which detects the current flowing through the feeding sides and the ground sides of the plurality of antennas; a uniformity calculation unit which calculates the uniformity index value of the current flowing through the plurality of antennas, on the basis of the current value detected by the current detection mechanism; and a reactance changing unit which sequentially changes the reactance of the plurality of reactance variable elements such that the uniformity index value calculated by the uniformity calculation unit approaches a predetermined set value.

13 Claims, 12 Drawing Sheets

(58) Field of Classification Search
USPC .......................... 315/111.21, 111.41, 111.51
See application file for complete search history.

(56) References Cited

U.S. PATENT DOCUMENTS

| | | | |
|---|---|---|---|
| 2010/0236917 A1* | 9/2010 | Mori ................. | H01J 37/32082 |
| | | | 422/186.04 |
| 2021/0022236 A1* | 1/2021 | Iwakoke ........... | H01J 37/32183 |
| 2021/0166917 A1* | 6/2021 | Van Zyl .................. | H03H 7/40 |

FOREIGN PATENT DOCUMENTS

| | | |
|---|---|---|
| JP | 2014216318 | 11/2014 |
| JP | 2016138598 | 8/2016 |
| JP | 2018041531 | 3/2018 |
| TW | 201501574 | 1/2015 |

OTHER PUBLICATIONS

"International Search Report (Form PCT/ISA/210) of PCT/JP2020/026951", dated Oct. 6, 2020, with English translation thereof, pp. 1-4.

\* cited by examiner

PLASMA CONTROL SYSTEM AND PLASMA CONTROL PROGRAM

CROSS-REFERENCE TO RELATED APPLICATION

This application is a 371 of international application of PCT application serial no. PCT/JP2020/026951, filed on Jul. 10, 2020, which claims the priority benefit of Japan application no. 2019-130261, filed on Jul. 12, 2019. The entirety of each of the above mentioned patent applications is hereby incorporated by reference herein and made a part of this specification.

TECHNICAL FIELD

The disclosure relates to a plasma control system that controls inductively coupled plasma generated by allowing a high-frequency current to flow through an antenna and a program used in the plasma control system.

BACKGROUND ART

As shown in Patent Literature 1, a plasma treatment device having a configuration in which a plurality of antennas are disposed on four sides of a substrate in a vacuum container and a high-frequency current flows through these antennas is known as a device that generates inductively coupled plasma (abbreviated as ICP).

More specifically, the plasma treatment device includes a variable impedance element connected to a plurality of antennas and a pickup coil or a capacitor provided on a feeding side of the plurality of antennas. Here, when the impedance of the variable impedance element is feedback-controlled based on the output value from the pickup coil or the capacitor, the density of plasma generated around each antenna is controlled such that it is within a predetermined range, and the density of plasma generated in the vacuum container is spatially made uniform.

However, when the substrate becomes large, it is not possible to cope with it by disposing a relatively short antenna as used in the plasma treatment device of Patent Literature 1 on four sides of the substrate, and in this case, the long antenna as shown in Patent Literature 2 is used.

When such a long antenna is disposed in a vacuum container and inductively coupled plasma is generated, a current flows between the antenna and the wall of the vacuum container via the plasma due to electrostatic coupling generated between the antenna and the plasma, and the current flows between antennas adjacent to each other via the plasma.

As a result, there is a problem that the distribution of the amount of the current in the longitudinal direction of the antenna is not uniform, and the plasma density is not uniform.

In addition, the inventors of the present application conducted extensive studies, and as a result, found that the above problem becomes more significant when a plurality of antennas are used. This is because, in order to make the distribution of the amount of the current flowing through one antenna uniform, the impedance of the impedance element connected to the antenna is changed, but the change in the impedance influences the amount of the current flowing through other antennas, and plasma density control becomes more difficult.

CITATION LIST

Patent Literature

[Patent Literature 1] Japanese Patent Laid-Open No. 2004-228354
[Patent Literature 2] Japanese Patent Laid-Open No. 2016-138598

SUMMARY

Technical Problem

Therefore, the disclosure has been made in order to address the above problem, and a main objective of the disclosure is to generate uniform plasma while it is possible to cope with an increase in size of a substrate using a plurality of antennas.

Solution to Problem

That is, a plasma control system according to the disclosure includes a high-frequency power supply; an antenna group including a plurality of antennas connected to the high-frequency power supply; a plurality of reactance variable elements connected to a feeding side and a ground side of the plurality of antennas; a current detection mechanism that detects a current flowing through the feeding side and the ground side of the plurality of antennas; a uniformity calculation unit that calculates a uniformity index value of the current flowing through the plurality of antennas based on a current value detected by the current detection mechanism; and a reactance changing unit that sequentially changes the reactances of the plurality of reactance variable elements so that the uniformity index value calculated by the uniformity calculation unit approaches a predetermined set value.

According to the plasma control system configured in this manner, since the reactances of the plurality of reactance variable elements sequentially change so that the uniformity index value approaches the set value, the current flowing through the plurality of antennas can be made as uniform as possible. As a result, it is possible to generate uniform plasma while it is possible to cope with an increase in size of a substrate using the plurality of antennas.

As a more specific embodiment, a configuration in which the antenna group includes at least the two of a first antenna and a second antenna which are connected to the high-frequency power supply and connected in series with each other, and at least the two of a third antenna and a fourth antenna which are connected to the high-frequency power supply, connected in series with each other, and connected in parallel to the first antenna and the second antenna, the reactance variable elements are provided on a feeding side of the first antenna, between the first antenna and the second antenna, on a ground side of the second antenna, on a feeding side of the third antenna, between the third antenna and the fourth antenna, and on a ground side of the fourth antenna, and the current detection mechanism detects a current flowing through the feeding side of the first antenna, between the first antenna and the second antenna, the ground side of the second antenna, the feeding side of the third antenna, between the third antenna and the fourth antenna, and the ground side of the fourth antenna may be exemplified.

With such a configuration, since the current flowing through each of the feeding side and the ground side of the antennas is detected, the current flowing through the antennas can be made as equal as possible, and since the reactance variable elements are provided on each of the feeding side and the ground side of the antennas, the plasma density can be controlled more finely.

Preferably, the uniformity calculation unit calculates the uniformity index value using a maximum value and a minimum value of the current value detected by the current detection mechanism as parameters.

When the uniformity index value calculated in this manner is used, the current flowing through the antennas can be made as equal as possible.

Preferably, when the reactance changing unit changes the reactance of the reactance variable element and the uniformity index value is away from the set value, the reactance of the reactance variable element is returned to the reactance before the change, and the reactance of the next reactance variable element changes.

With such a configuration, the uniformity index value can be made to reliably approach the set value.

Preferably, the reactance changing unit compares a threshold value different from the set value with the uniformity index value and makes a reactance change amount different between when the uniformity index value is larger than the threshold value and when the uniformity index value is smaller than the threshold value.

With such a configuration, the reactance change amount can be increased until the uniformity index value reaches the threshold value, and the reactance change amount can be reduced until the uniformity index value reaches the threshold value and then reaches the set value. Thereby, the control time can be shortened.

Preferably, the reactance changing unit makes the reactance change amount different according to a current reactance of the reactance variable element.

With such a configuration, the reactance change amount can be adjusted appropriately depending on whether the reactance variable element can change the reactance slowly or the reactance varies greatly.

Preferably, the plasma control system further includes a weighted value storage unit that stores a weighted value indicating the degree of influence on the uniformity index value, which is a value weighted in advance for each of the plurality of reactance variable elements, wherein the reactance changing unit changes the reactances of the plurality of reactance variable elements in the order from those having a larger weighted value.

With such a configuration, since the reactances of the reactance variable elements can be changed in the order from those having a higher influence on the uniformity index value, control can be performed efficiently.

In addition, a plasma control program according to the disclosure is a program used in a plasma control system including a high-frequency power supply, an antenna group including a plurality of antennas connected to the high-frequency power supply, a plurality of reactance variable elements connected to a feeding side and a ground side of the plurality of antennas, and a current detection mechanism that detects a current flowing through the feeding side and the ground side of the plurality of antennas, and the program allows to a computer to function as a uniformity calculation unit that calculates a uniformity index value of the current flowing through the plurality of antennas based on a current value detected by the current detection mechanism and a reactance changing unit that sequentially changes the reactances of the plurality of reactance variable elements so that the uniformity index value calculated by the uniformity calculation unit approaches a predetermined set value.

According to such a plasma control program, it is possible to exhibit the same operations and effects as in the above plasma control system.

Advantageous Effects of Invention

According to the disclosure configured in this manner, it is possible to generate uniform plasma in a longitudinal direction of antennas while it is possible to cope with an increase in size of a substrate using a long antenna.

DESCRIPTION OF THE EMBODIMENTS

Hereinafter, a plasma control system of one embodiment according to the disclosure will be described with reference to the drawings.

<System Configuration>

Figure 1:
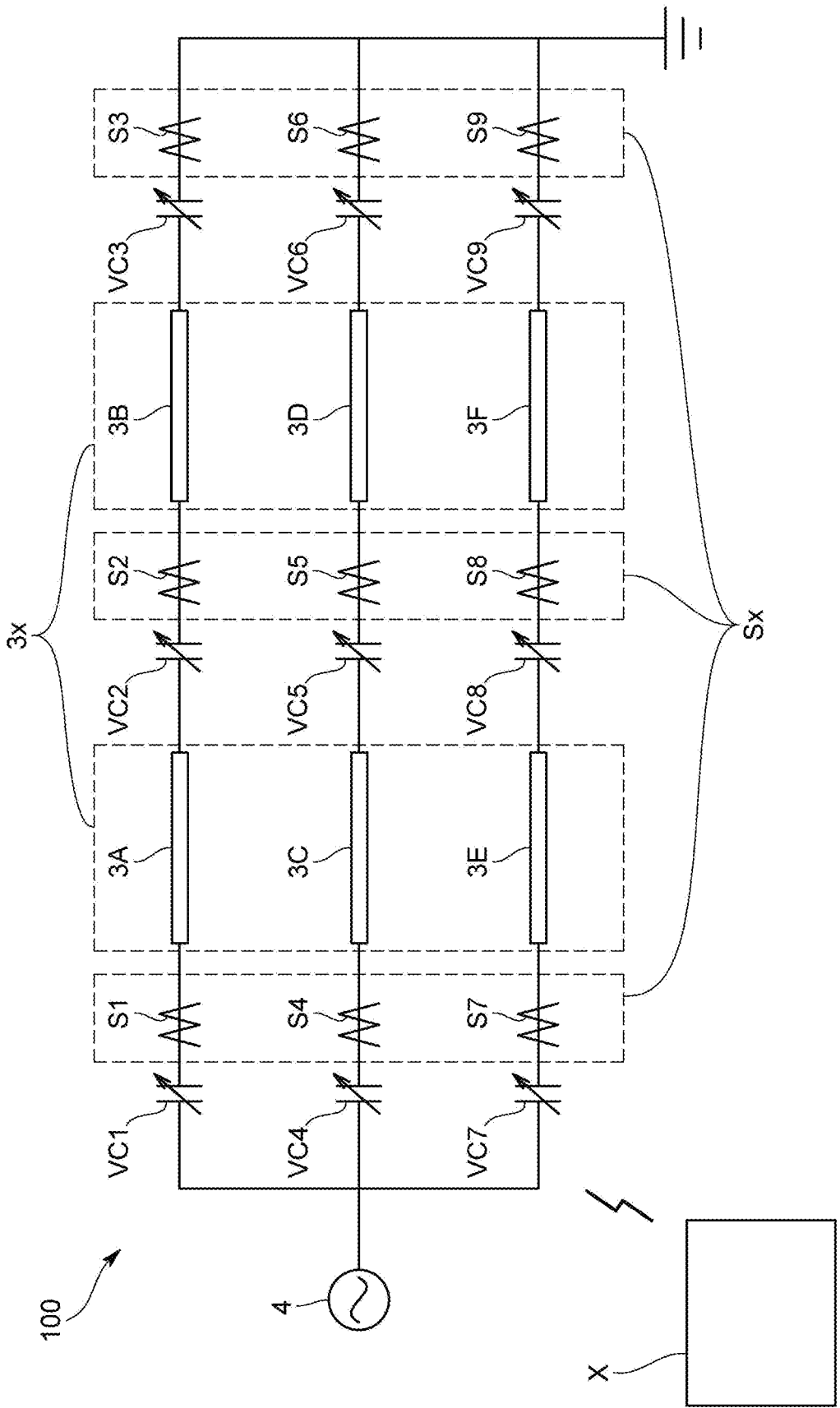
FIG. 1 is a schematic view showing a configuration of a plasma control system of the present embodiment.

As shown in FIG. 1, a plasma control system 200 of the present embodiment includes at least a plasma treatment device 100 that processes a substrate using inductively coupled plasma and a control device X for controlling the plasma.

First, the plasma treatment device 100 will be described.

Figure 2:
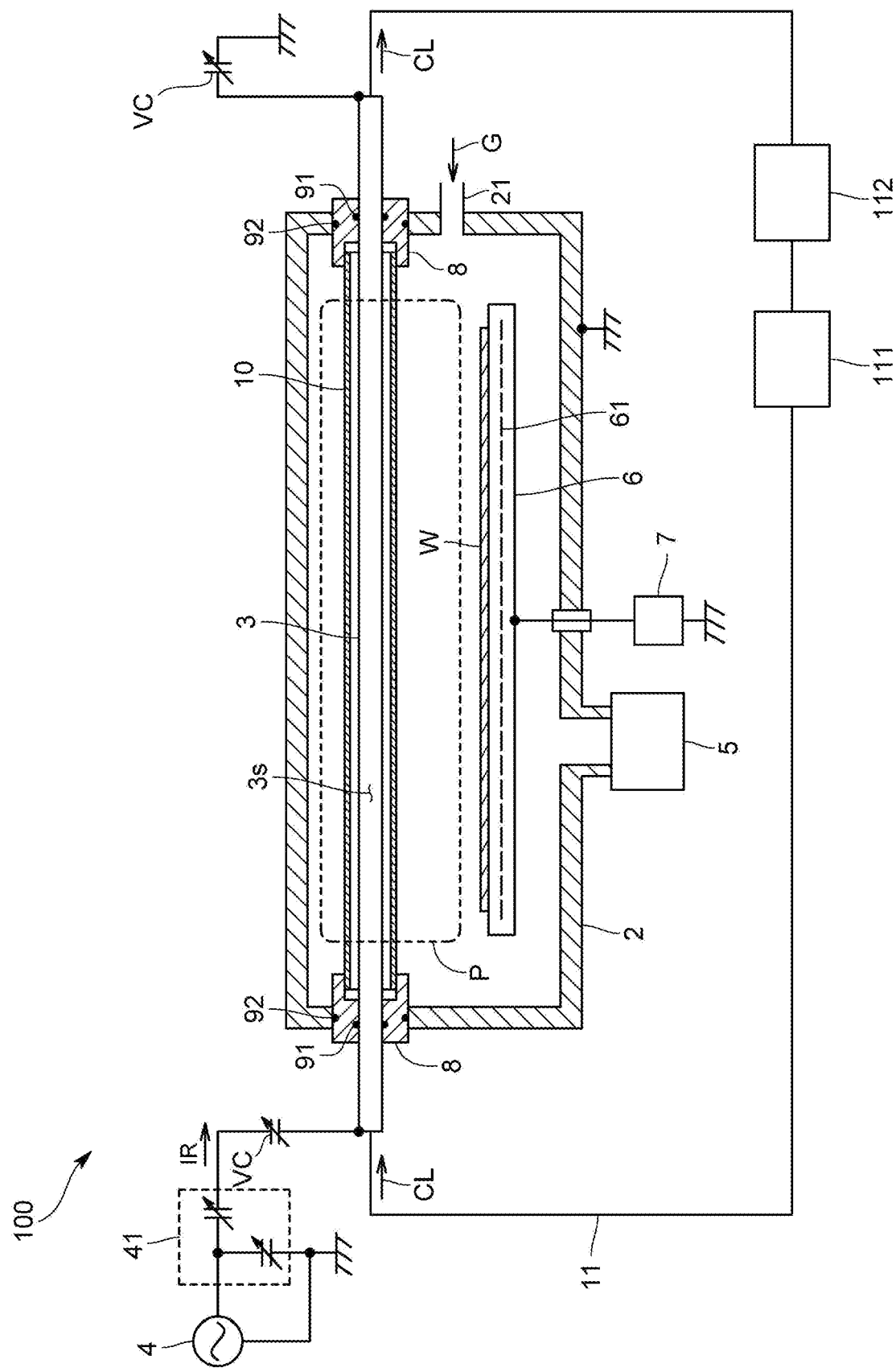
FIG. 2 is a vertical cross-sectional view schematically showing a configuration of a plasma treatment device of the same embodiment.

As shown in FIG. 2, for example, the plasma treatment device 100 applies a treatment such as film formation by a plasma CVD method, etching, ashing, or sputtering on a substrate W. The substrate W is, for example, a substrate for a flat panel display (FPD) such as a liquid crystal display or an organic EL display, or a flexible substrate for a flexible display.

Here, the plasma treatment device 100 is also called a plasma CVD device when film formation is performed by a plasma CVD method, a plasma etching device when etching is performed, a plasma ashing device when ashing is performed, and a plasma sputtering device when sputtering is performed.

Specifically, the plasma treatment device 100 includes a vacuum container 2 which is vacuum-exhausted and a gas G is introduced, a long antenna 3 disposed in the vacuum container 2, and a high-frequency power supply 4 that applies a high frequency to the antenna 3 in order to generate inductively coupled plasma P in the vacuum container 2. Here, by applying a high frequency from the high-frequency power supply 4 to the antenna 3, a high-frequency current IR flows through the antenna 3, an inductive electric field is generated in the vacuum container 2, and inductively coupled plasma P is generated.

The vacuum container 2 is, for example, a metal container, and the inside thereof is vacuum-exhausted by a vacuum exhaust device 5. In this example, the vacuum container 2 is electrically grounded.

For example, a gas G is introduced into the vacuum container 2 via a flow rate adjusting container (not shown) and a gas introduction port 21 formed on the side wall of the vacuum container 2. The gas G may be set according to the details of treatments performed on the substrate W.

In addition, a substrate holder 6 for holding the substrate W is provided in the vacuum container 2. As in this example, a bias voltage may be applied to the substrate holder 6 from a bias power supply 7. The bias voltage is, for example, a negative DC voltage or a negative pulse voltage, but the disclosure is not limited thereto. With such a bias voltage, for example, the energy when positive ions in the plasma P enter the substrate W can be controlled, and the degree of crystallization of a film formed on the surface of the substrate W and the like can be controlled. A heater 61 for heating the substrate W may be provided in the substrate holder 6.

Here, the antenna 3 has a linear shape, and is disposed above the substrate W in the vacuum container 2 and along the surface of the substrate W (for example, substantially parallel to the surface of the substrate W).

The vicinity of both ends of the antenna 3 penetrates the side walls of the vacuum container 2 facing each other. Each insulation member 8 is provided at a part that penetrates both ends of the antenna 3 to the outside of the vacuum container 2. Both ends of the antenna 3 penetrate each insulation member 8 and the penetrating part is vacuum-sealed by, for example, packing 91. The space between each insulation member 8 and the vacuum container 2 is also vacuum-sealed by, for example, packing 92. Here, the material of the insulation member 8 is, for example, a ceramic such as alumina, quartz, or engineering plastic such as polyphenylene sulfide (PPS) or polyether ether ketone (PEEK).

In addition, in the antenna 3, the part positioned inside the vacuum container 2 is covered with a straight tubular insulation cover 10. Both ends of the insulation cover 10 are supported by the insulation member 8. Here, the material of the insulation cover 10 is, for example, quartz, alumina, fluororesin, silicon nitride, silicon carbide, or silicon.

Here, the plurality of antennas 3 have a hollow structure having a flow path 3S through which a liquid coolant CL flow therein. In the present embodiment, they are a metal pipe forming a straight tube. The material of the metal pipe is, for example, copper, aluminum, alloys thereof, or stainless steel.

Here, the liquid coolant CL flows through the antenna 3 via a circulation flow path 11 provided outside the vacuum container 2, and at the circulation flow path 11, a temperature control mechanism 111 such as a heat exchanger for adjusting the temperature of the liquid coolant CL to be constant, and a circulation mechanism 112 such as a pump for circulating the liquid coolant CL through the circulation flow path 11 are provided. As the liquid coolant CL, in consideration of electrical insulation, water having high resistance is preferable, and for example, pure water or water close thereto is preferable. In addition, for example, a liquid coolant other than water such as a fluorine-based inactive liquid may be used.

Figure 3:
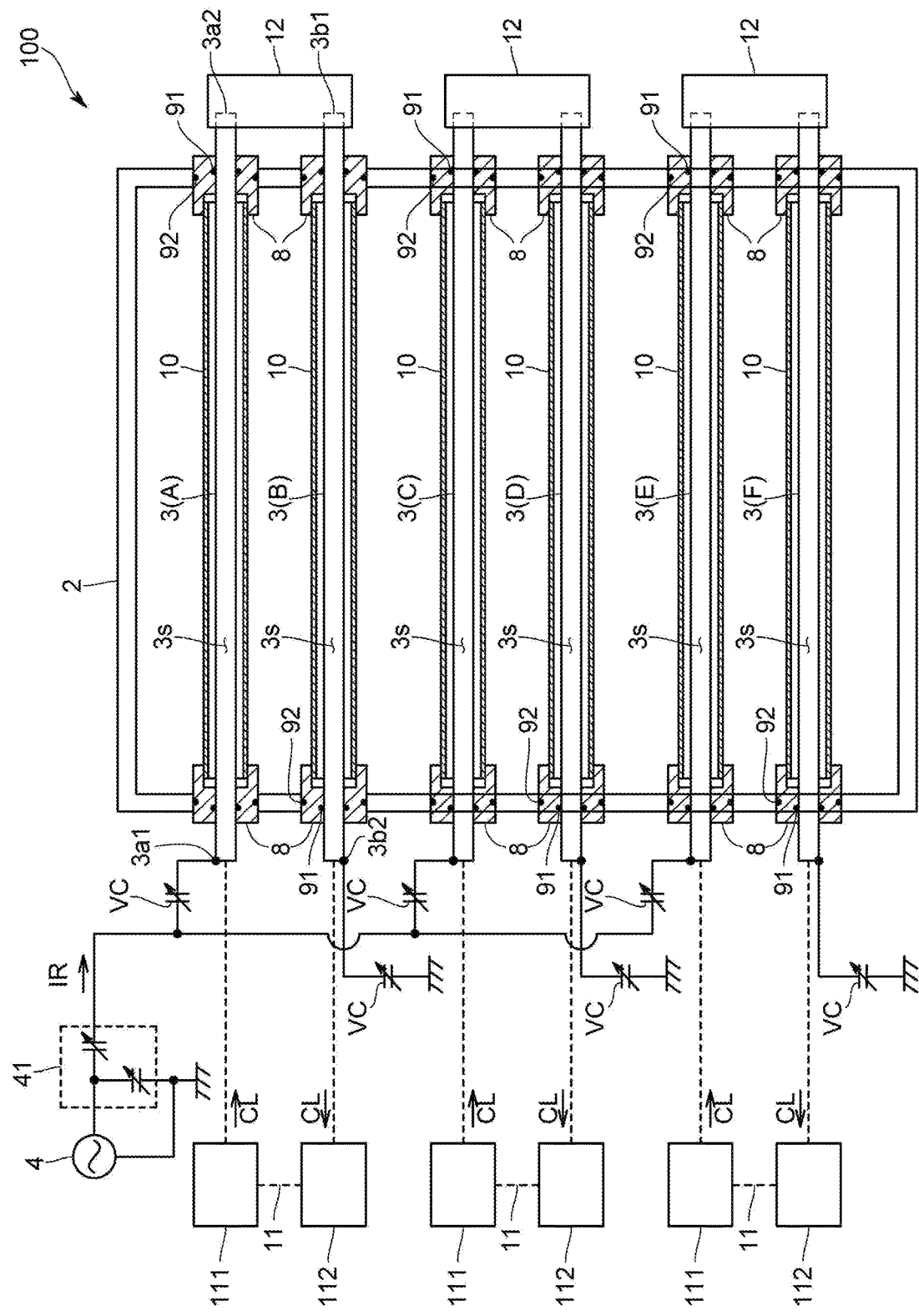
FIG. 3 is a horizontal cross-sectional view schematically showing a configuration of the plasma treatment device of the same embodiment.

As shown in FIG. 1 and FIG. 3, the plurality of above antennas 3 are provided. That is, the plasma treatment device 100 of the present embodiment includes an antenna group $3x$ composed of a plurality of antennas connected to the high-frequency power supply 4.

The antenna group $3x$ is formed by connecting a plurality of sets of at least two antennas 3 connected in series in parallel, and here, it is composed of a total of six antennas 3 obtained by connecting three sets of two antennas connected in series in parallel.

In the following, for convenience of description, three sets of a first antenna 3A and a second antenna 3B, a third antenna 3C and a fourth antenna 3D, and a fifth antenna 3E and a sixth antenna 3F, which are connected in series, are connected in parallel.

As shown in FIG. 3, the plurality of antennas 3 connected in series are connected by a connecting conductor 12 to form one antenna structure. That is, the ends of the antennas 3 adjacent to each other extending to the outside of the vacuum container 2 are electrically connected by the connecting conductor 12. More specifically, in the present embodiment, two antennas 3 are connected by the connecting conductor 12, and the end of one antenna 3 and the end of the other antenna 3 are electrically connected.

In the following, the connecting conductor 12 that connects the first antenna 3A and the second antenna 3B will be described, but the connecting conductor that connects the third antenna 3C and the fourth antenna 3D, and the connecting conductor that connects the fifth antenna 3E and the sixth antenna 3F have the same configuration.

The ends of the first antenna 3A and the second antenna 3B connected by the connecting conductor 12 are the ends positioned on the same side wall side. Thereby, the high-frequency currents IR in opposite directions flow through the first antenna 3A and the second antenna 3B.

Here, the connecting conductor 12 has a flow path therein, and has a configuration in which the liquid coolant CL flows through the flow path. Specifically, one end of the connecting conductor 12 communicates with the flow path of the first antenna 3A, and the other end of the connecting conductor 12 communicates with the flow path of the second antenna 3B. Thereby, in the antennas 3A and 3B adjacent to each other, the liquid coolant CL that has flowed through the first antenna 3A flows through the second antenna 3B via the flow path of the connecting conductor 12. Thereby, the plurality of antennas 3 can be cooled with the common liquid coolant CL. In addition, since the plurality of antennas 3 can be cooled through one flow path, the configuration of the circulation flow path 11 can be simplified.

One end (here, one end of the first antenna 3A) of the antennas 3A and 3B that is not connected by the connecting conductor 12 becomes a feeding side end $3a1$, and the high-frequency power supply 4 is connected to the feeding side end $3a1$ via a matching circuit 41. In addition, a terminal part $3b2$, which is the other end (here, the other end of the second antenna 3B), is grounded.

With the above configuration, the high-frequency current IR can flow from the high-frequency power supply 4 to the antenna 3 via the matching circuit 41. The frequency of the high frequency is, for example, generally, 13.56 MHz, but the disclosure is not limited thereto.

<Configuration of Connecting Conductor 12>

Next, the connecting conductor 12 will be described in detail with reference to FIG. 4 to FIG. 8. Here, in FIG. 4 and FIG. 5, some sealing members and the like are omitted.

Figure 4:
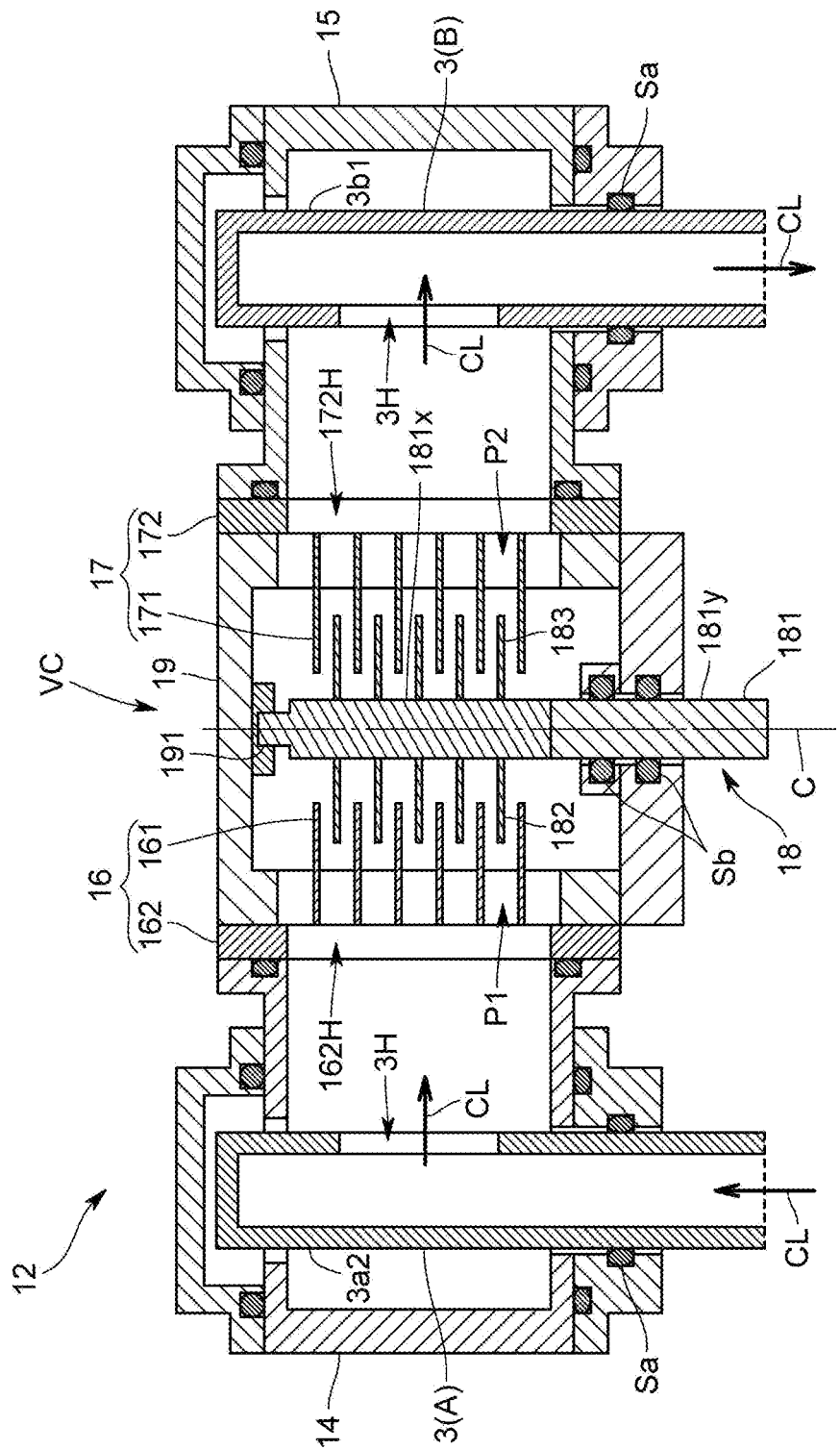
FIG. 4 is a horizontal cross-sectional view schematically showing a connecting conductor of the same embodiment.
Figure 5:
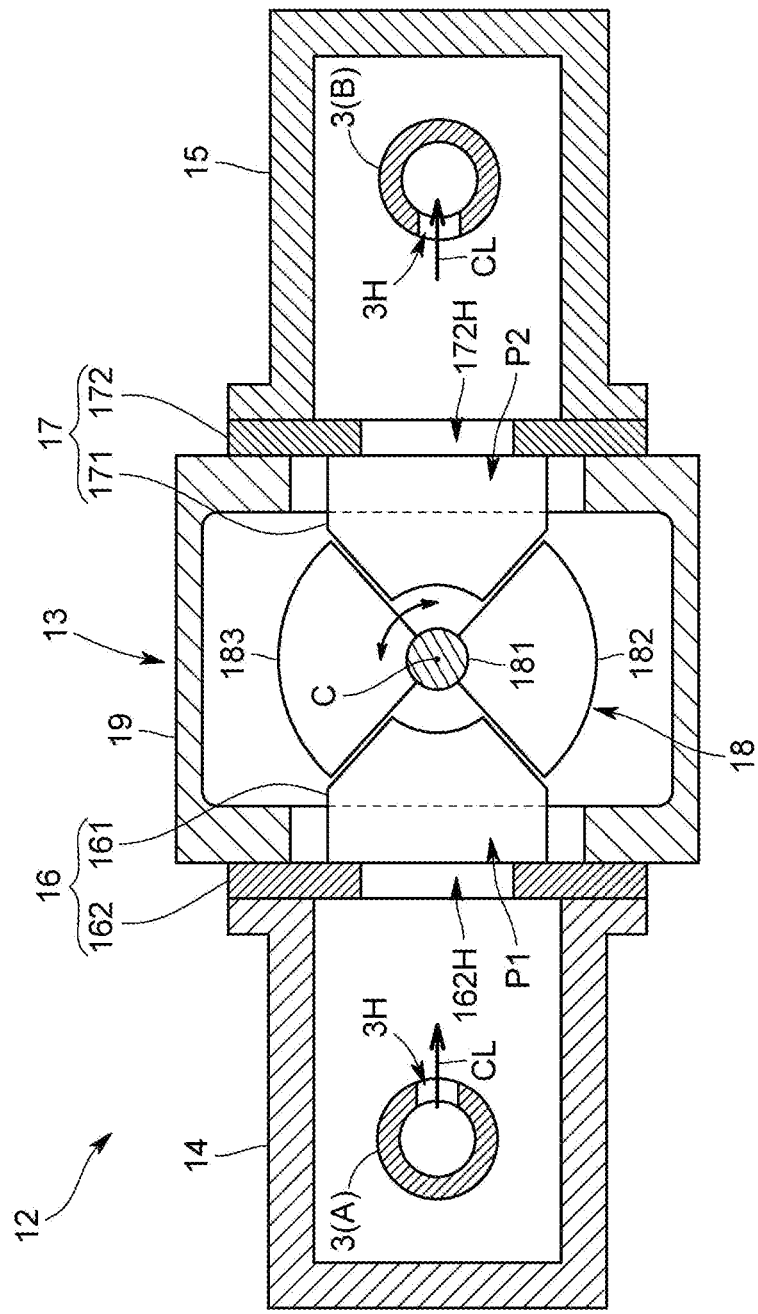
FIG. 5 is a vertical cross-sectional view schematically showing a connecting conductor of the same embodiment.

As shown in FIG. 4 and FIG. 5, the connecting conductor 12 includes a variable capacitor VC electrically connected to each of the antennas 3A and 3B, a first connecting part 14 that connects the variable capacitor VC and the other end 3a2 of the first antenna 3A, and a second connecting part 15 that connects the variable capacitor VC and one end 3b1 of the second antenna 3B.

The first connecting part 14 electrically contacts the antenna 3A by surrounding the other end 3a2 of the first antenna 3A, and guides the liquid coolant CL to the variable capacitor VC from an opening 3H formed at the other end 3a2 of the antenna 3A.

The second connecting part 15 electrically contacts the antenna 3B by surrounding the one end 3b1 of the second antenna 3B and guides the liquid coolant CL that has passed through the variable capacitor VC to the opening 3H formed at the one end 3b1 of the antenna 3B.

The material of these connecting parts 14 and 15 is, for example, copper, aluminum, alloys thereof, or stainless steel.

Each of the connecting parts 14 and 15 of the present embodiment is liquid-tightly mounted at the end of the antenna 3 via a sealing member Sa such as an O-ring on the side of the vacuum container 2 with respect to the opening 3H, and is configured not to restrain the outside of the opening 3H (refer to FIG. 4). Thereby, it has a configuration that allows a light inclination of the antenna 3 with respect to the connecting parts 14 and 15.

The variable capacitor VC includes a first fixed electrode 16 electrically connected to the first antenna 3A, a second fixed electrode 17 electrically connected to the second antenna 3B, and a movable electrode 18, which is a movable element that forms a first capacitor between it and the first fixed electrode 16 and forms a second capacitor between it and the second fixed electrode 17.

The variable capacitor VC of the present embodiment has a configuration in which the movable electrode 18 can rotate around a predetermined rotation axis C and the capacitance thereof can be changed. Here, the variable capacitor VC includes an insulating storage container 19 in which the first fixed electrode 16, the second fixed electrode 17 and the movable electrode 18 are accommodated.

The storage container 19 has an introduction port P1 through which the liquid coolant CL is introduced from the first antenna 3A and an introduction port P2 through which a liquid coolant CL is introduced to the second antenna 3B. The introduction port P1 is formed on one side wall (the left side wall in FIG. 4) of a storage container 19, the introduction port P2 is formed on the other side wall (the right side wall in FIG. 4) of the storage container 19, and the introduction port P1 and the introduction port P2 are provided at positions facing each other. Here, the storage container 19 of the present embodiment has a substantially rectangular parallelepiped shape having a hollow portion therein, but it may have other shapes.

The first fixed electrode 16 and the second fixed electrode 17 are provided at different positions around the rotation axis C of the movable electrode 18. In the present embodiment, the first fixed electrode 16 that is inserted into the storage container 19 from the introduction port P1 of the storage container 19 is provided. In addition, the second fixed electrode 17 that is inserted into the storage container 19 from the introduction port P2 of the storage container 19 is provided. Thereby, the first fixed electrode 16 and the second fixed electrode 17 are provided at positions that are symmetric with respect to the rotation axis C.

Figure 6:
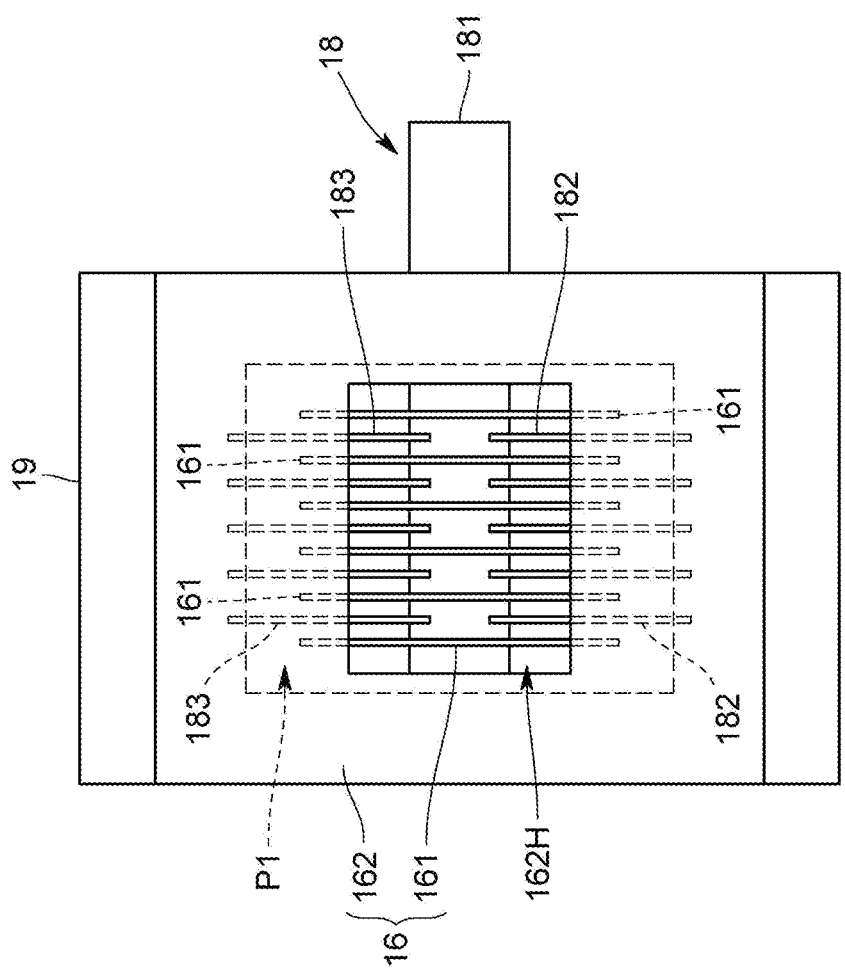
FIG. 6 is a side view of a variable capacitor of the same embodiment when viewed from the side of an introduction port.

As shown in FIG. 5 and FIG. 6, the first fixed electrode 16 has a plurality of first fixed metal plates 161 provided to face each other. In addition, the second fixed electrode 17 has a plurality of second fixed metal plates 171 provided to face each other. The fixed metal plates 161 and 171 are provided at substantially equal intervals along the rotation axis C.

Here, the plurality of first fixed metal plates 161 have the same shape as each other, and are supported by a first flange member 162. The first flange member 162 is fixed to the left side wall on which the introduction port P1 of the storage container 19 is formed. Here, a through-hole 162H communicating with the introduction port P1 is formed at the first flange member 162. In addition, the plurality of second fixed metal plates 171 have the same shape as each other, and are supported by a second flange member 172. The second flange member 172 is fixed to the right side wall on which the introduction port P2 of the storage container 19 is formed. Here, a through-hole 172H communicating with the introduction port P2 is formed at the second flange member 172. The plurality of first fixed metal plates 161 and the plurality of second fixed metal plates 171 that are fixed to the storage container 19 are provided at positions that are symmetric with respect to the rotation axis C.

Figure 7:
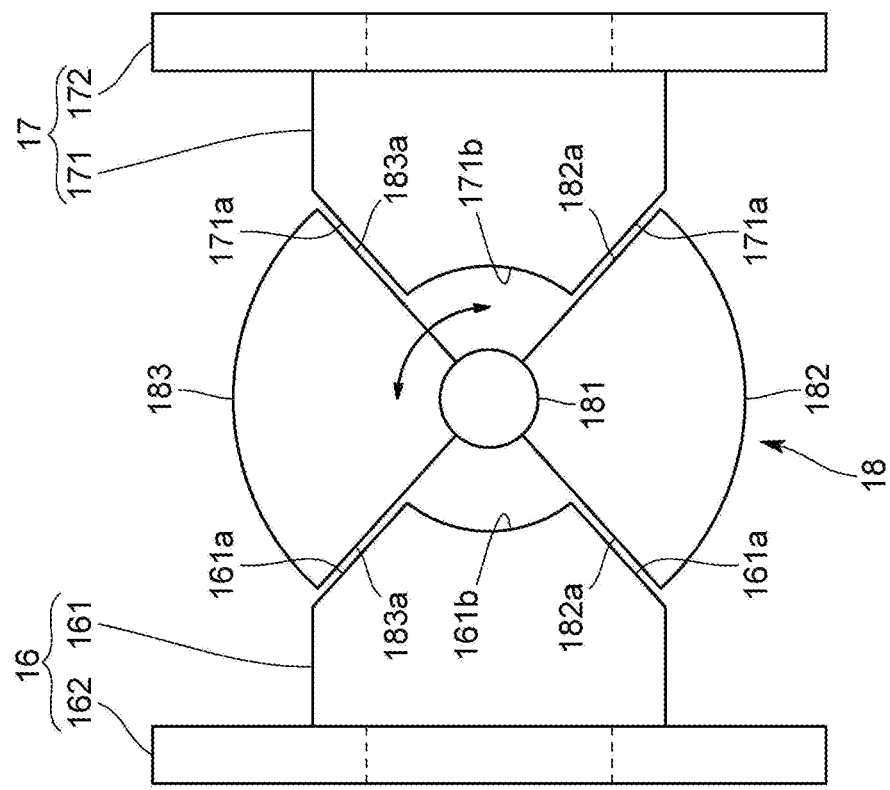
FIG. 7 is a schematic view showing a state in which a fixed metal plate and a movable metal plate of the same embodiment do not face each other.

In addition, the first fixed metal plate 161 and the second fixed metal plate 171 have a flat plate shape, and as shown in FIG. 7, have a shape whose width decreases toward the rotation axis C in a plan view. Here, in the fixed metal plates 161 and 171, end sides 161a and 171a whose widths decrease are formed in the radial direction of the rotation axis C. Here, the angle formed by the end sides 161a and 171a facing each other is 90 degrees. In addition, tip sides 161b and 171b of the fixed metal plates 161 and 171 on the side of the rotation axis C have an arc shape.

As shown in FIG. 4 and FIG. 5, the movable electrode 18 includes a rotating shaft 181 that is rotatable around the rotation axis C and supported on the side wall (in FIG. 4, the front side wall) of the storage container 19, a first movable metal plate 182 that is supported by the rotating shaft 181 and faces the first fixed electrode 16, and a second movable metal plate 183 that is supported by the rotating shaft 181 and faces the second fixed electrode 17.

The rotating shaft 181 has a linear shape extending along the rotation axis C. The rotating shaft 181 has one end that is configured to extend from the front side wall of the storage container 19 to the outside. Here, it is rotatably supported by a sealing member Sb such as an O-ring on the front side wall of the storage container 19. Here, two points are supported by two O-rings on the front side wall. In addition, the other end of the rotating shaft 181 is rotatably in contact with a positioning recess 191 provided on the inner surface of the storage container 19.

In addition, in the rotating shaft 181, a part 181x that supports the first movable metal plate 182 and the second movable metal plate 183 is formed of a conductive material such as a metal, and a part 181y that extends from the storage container 19 to the outside is formed of an insulating material such as a resin.

The plurality of first movable metal plates 182 are provided to correspond to the first fixed metal plates 161. Here, the first movable metal plates 182 have the same shape. In addition, the plurality of second movable metal plates 183 are provided to correspond to the second fixed metal plates 171. Here, the second movable metal plates 183 have the same shape. The movable metal plates 182 and 183 are provided at substantially equal intervals along the rotation axis C. In addition, in the present embodiment, the movable metal plates 182 and 183 are interposed between the fixed metal plates 161 and 171. In FIG. 4, the number of fixed metal plates 161 and 171 is six, the number of movable metal plates 182 and 183 is five, but the disclosure is not limited thereto. Here, the gap between the movable metal plates 182 and 183 and the fixed metal plates 161 and 171 is, for example, 1 mm.

As shown in FIG. 5, the first movable metal plate 182 and the second movable metal plate 183 are provided at positions that are symmetric with respect to the rotation axis C and have the same shape as each other. Specifically, as shown in FIG. 7, the movable metal plates 182 and 183 have a fan shape that expands radially outward from the rotation axis C in a plan view. In the present embodiment, it has a fan shape having a central angle of 90 degrees.

Figure 8:
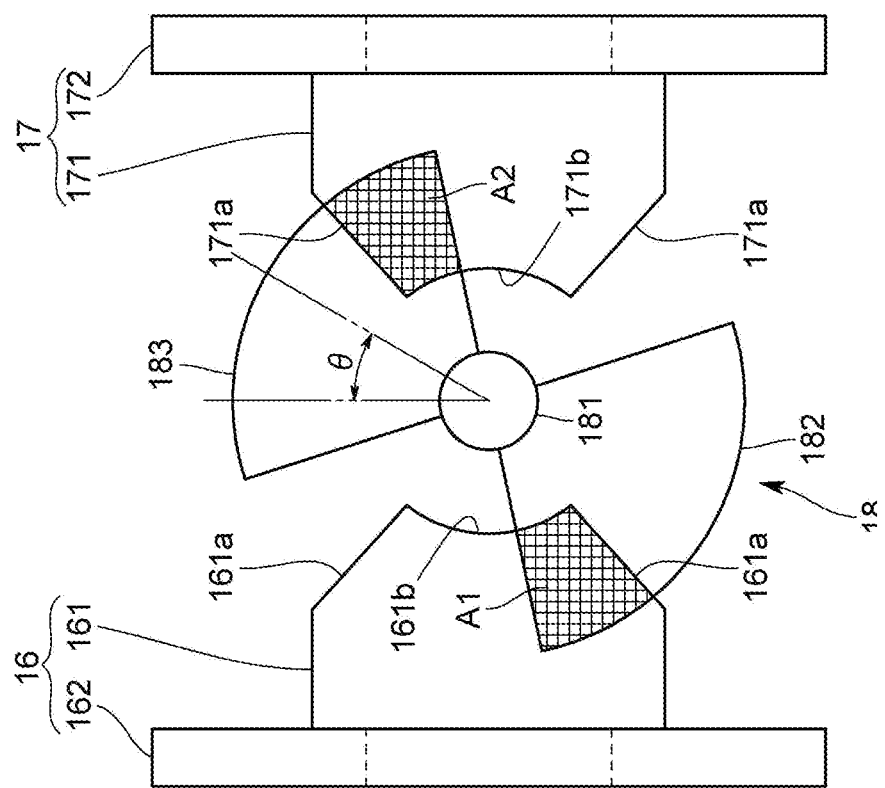
FIG. 8 is a schematic view showing a state in which a fixed metal plate and a movable metal plate of the same embodiment face each other.

By rotating the movable electrode 18 in the variable capacitor VC configured in this manner, as shown in FIG. 8, a facing area (a first facing area A1) between the first fixed metal plate 161 and the first movable metal plate 182 changes, and a facing area (a second facing area A2) between the second fixed metal plate 171 and the second movable metal plate 183 changes. In the present embodiment, the first facing area A1 and the second facing area A2 changes in the same manner. In addition, the tip sides 161*b* and 171*b* of the fixed metal plates 161 and 171 on the side of the rotation axis C have an arc shape, and by rotating the movable electrode 18, the first facing area A1 and the second facing area A2 change in proportion of the rotation angle θ of the movable electrode 18.

In the above configuration, when the liquid coolant CL flows from the introduction port P1 of the storage container 19, the inside of the storage container 19 is filled with the liquid coolant CL. In this case, the space between the first fixed metal plate 161 and the first movable metal plate 182 is filled with the liquid coolant CL, and the space between the second fixed metal plate 171 and the second movable metal plate 183 is filled with the liquid coolant CL. Thereby, the liquid coolant CL becomes a dielectric of the first capacitor and a dielectric of the second capacitor. In the present embodiment, the capacitance of the first capacitor and the capacitance of the second capacitor are the same. In addition, the first capacitor and the second capacitor configured in this manner are connected in series, and the capacitance of the variable capacitor VC is half the capacitance of the first capacitor (or the second capacitor).

The connecting conductor 12 configured in this manner may be provided between the antenna 3 and the high-frequency power supply 4. In this case, the first fixed electrode 16 is electrically connected to the high-frequency power supply 4, and the second fixed electrode 17 is electrically connected to the antenna 3.

In addition, the connecting conductor 12 may be provided between the antenna 3 and the ground. In this case, the first fixed electrode 16 is electrically connected to the antenna 3, and the second fixed electrode 17 is grounded.

With this configuration, the variable capacitor VC is connected to the feeding side and the ground side of the plurality of antennas constituting the antenna group 3*x*.

Here, as shown in FIG. 1 and FIG. 3, the variable capacitor VC is connected to the feeding side and the ground side of the antennas 3A to 3F, and in the following, as shown in FIG. 1, the variable capacitors VC connected to nine points on the feeding side of the first antenna 3A, between the first antenna 3A and the second antenna 3B, the ground side of the second antenna 3B, the feeding side of the third antenna 3C, between the third antenna 3C and the fourth antenna 3D, the ground side of the fourth antenna 3D, the feeding side of the fifth antenna 3E, between the fifth antenna 3E and the sixth antenna 3F, and the ground side of the sixth antenna 3F are called a first variable capacitor VC1, a second variable capacitor VC2, a third variable capacitor VC3, a fourth variable capacitor VC4, a fifth variable capacitor VC5, a sixth variable capacitor VC6, a seventh variable capacitor VC7, an eighth variable capacitor VC8, and a ninth variable capacitor VC9, respectively.

Therefore, as shown in FIG. 1, the plasma control system 200 of the present embodiment further includes a current detection mechanism Sx that detects a current flowing through the feeding side and the ground side of the plurality of antennas 3 constituting the antenna group 3*x*, and the above control device X has a configuration in which the reactance of the variable capacitor VC sequentially changes based on the current value detected by the current detection mechanism Sx. Here, in FIG. 2 and FIG. 3, the description of the current detection mechanism Sx is omitted.

The current detection mechanism Sx detects a current flowing through the feeding side and the ground side of the antennas 3A to 3F, and is composed of a plurality of current detection units S1 to S9 provided on the feeding side and the ground side of the antennas 3A to 3F.

The current detection units S1 to S9 are, for example, a current monitor such as a current transformer, and the detected detection signal is converted from an alternating current to a direct current by a DC conversion circuit, converted from an analog signal to a digital signal by an AD converter, and output to the control device X.

Figure 9:
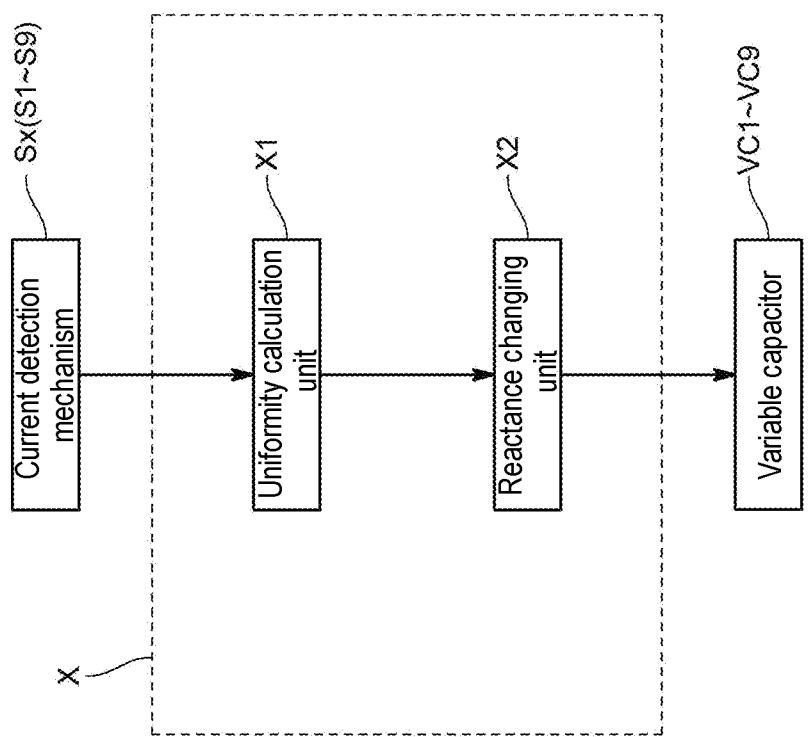
FIG. 9 is a functional block diagram showing functions of a control device of the same embodiment.

The control device X is physically a computer such as a PLC including a CPU, a memory, an input/output interface and the like, and when a plasma control program stored in the memory is executed, and the devices collaborate with each other, as shown in FIG. 9, at least functions of a uniformity calculation unit X1 and a reactance changing unit X2 are exhibited.

The uniformity calculation unit X1 acquires the detection signal detected by the current detection units S1 to S9, and calculates a uniformity index value indicating the uniformity of the current that flows through the plurality of antennas 3A to 3F based on the current value indicated by each detection signal.

The uniformity index value is a value calculated using at least a part of the current value detected by the current detection units S1 to S9 as a parameter, and a smaller value indicates higher uniformity of the current flowing through the antennas 3A to 3F, and a higher value indicates lower uniformity of the current flowing through the antennas 3A to 3F.

The uniformity calculation unit X1 here is configured to calculate the uniformity index value using the maximum value and the minimum value of the current value detected by the current detection units S1 to S9 as parameters, and specifically, the following calculation formula is used.

uniformity index value $Ix$=(maximum value $I$ max−minimum value $I$ min)/(maximum value $I$ max+minimum value $I$ min)×100(%)

Here, the uniformity index value Ix is not limited to the value calculated by the above calculation formula, but it may be calculated using, for example, the average value or the standard deviation of the current value detected by the current detection units S1 to S9.

The reactance changing unit X2 sequentially changes the reactances of the plurality of variable capacitors VC so that the uniformity index value Ix calculated by the uniformity calculation unit X1 approaches a predetermined set value Is.

Here, the reactance changing unit X2 changes the capacitance by outputting a drive signal to the drive unit that rotates the movable electrode 18 of the variable capacitor VC, and is configured to change the capacitances of the first variable capacitor VC1 to the ninth variable capacitor VC9 in a predetermined order.

Figure 10:
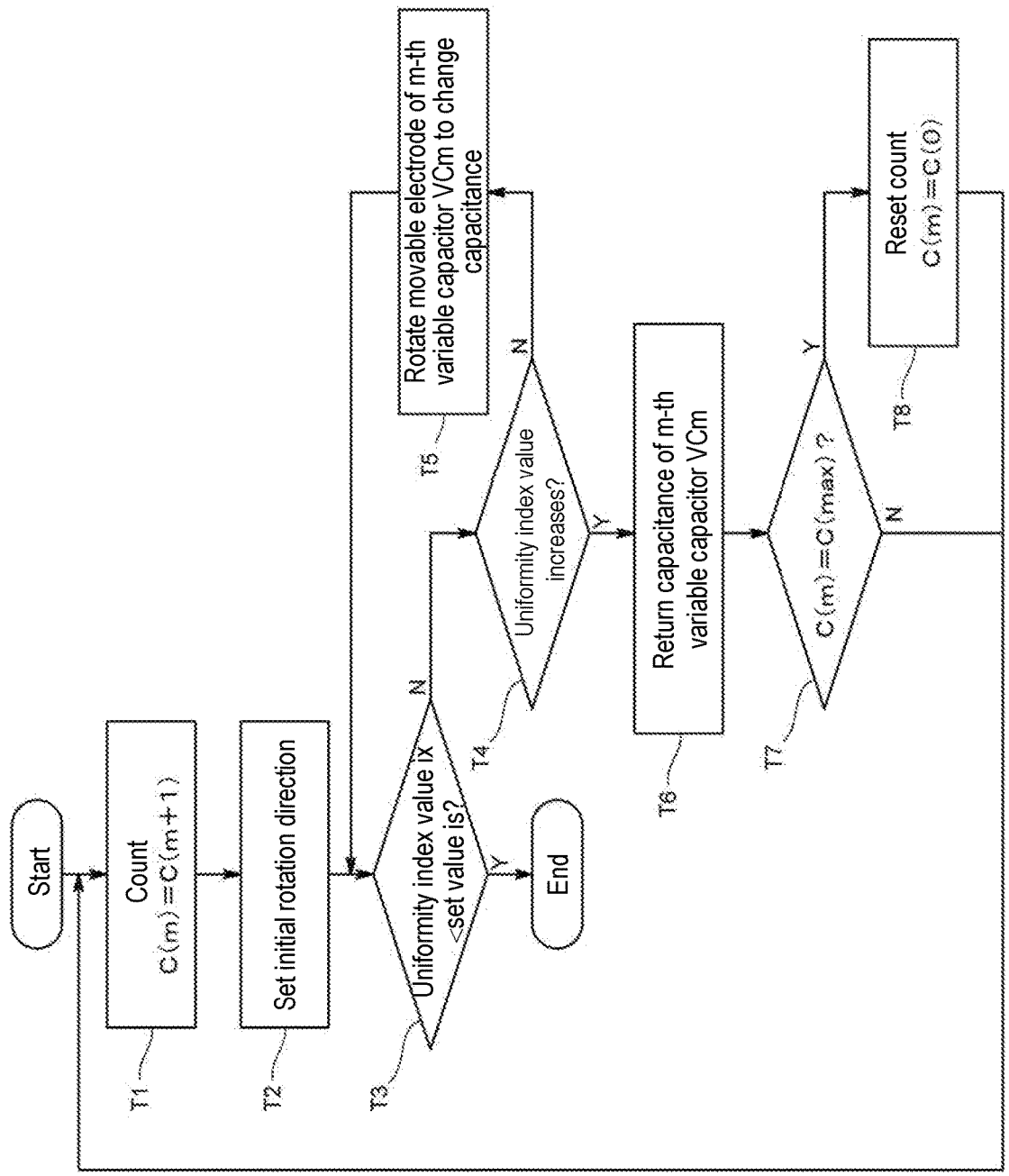
FIG. 10 is a flowchart for explaining operations of the control device of the same embodiment.

Hereinafter, a case in which the capacitances of the first variable capacitor VC1 to the ninth variable capacitor VC9 are set to be changed in this order will be described with reference to the flowchart of FIG. 10.

First, the reactance changing unit X2 sets a counter using a counter circuit (T1). Specifically, the count number m is increased by increasing the count number m indicating the number of operations so far by 1.

Subsequently, when the reactance changing unit X2 changes the capacitance of the m-th variable capacitor VCm according to the count number m in T1, the initial rotation direction of the movable electrode 18 is set to either a forward rotation direction or a reverse rotation direction, and in other words, the initial change direction of the capacitance of the m-th variable capacitor VCm is set to either an increase direction or a decrease direction (T2).

Specifically, first, the movable electrode 18 is rotated by a predetermined angle (for example, 3°), for example, in the forward rotation direction (for example, a direction in which the impedance increases). Thereby, when the uniformity index value Ix approaches the set value Is, the forward rotation direction is set as the initial rotation direction, and on the other hand, when the uniformity index value Ix is away from the set value Is, the reverse rotation direction is set as the initial rotation direction. Here, it is not always possible to perform rotation in the forward rotation direction first, and the initial rotation direction may be set by performing rotation in the reverse rotation direction.

Next, the reactance changing unit X2 compares the uniformity index value Ix with the set value Is and determines whether the uniformity index value Ix reaches the set value Is, and in other words, determines whether the uniformity index value Ix is smaller than the set value Is (T3).

In T3, when the uniformity index value Ix is smaller than the set value Is, the control is terminated.

On the other hand, in T3, when the uniformity index value Ix is equal to or larger than the set value Is, the reactance changing unit X2 determines whether the movable electrode 18 is rotated and thus the uniformity index value Ix is larger than the value before the rotation (T4).

In T4, when the uniformity index value Ix decreases, the reactance changing unit X2 rotates the movable electrode 18 of the above m-th variable capacitor VCm in the initial rotation direction by a predetermined angle (for example, 3°), and the capacitance changes (T5), and the state returns to T3.

On the other hand, in T4, when the uniformity index value Ix increases, the reactance changing unit X2 rotates the movable electrode 18 of the m-th variable capacitor VCm in a direction (for example, a direction in which the impedance decreases) opposite to the initial rotation direction by the above predetermined angle (for example, 3°), and returns the capacitance of the m-th variable capacitor VCm to a state before the change (T6).

Then, it is determined whether the count number m matches the maximum count number (9 in the present embodiment) which is a total number of variable capacitors VC to be controlled (T7), and if they match, the count number m is reset to 0 (T8), the state returns to T1, and if they do not match, the state returns to T1 while the count number m is maintained.

Effects of the Present Embodiment

Figure 11:
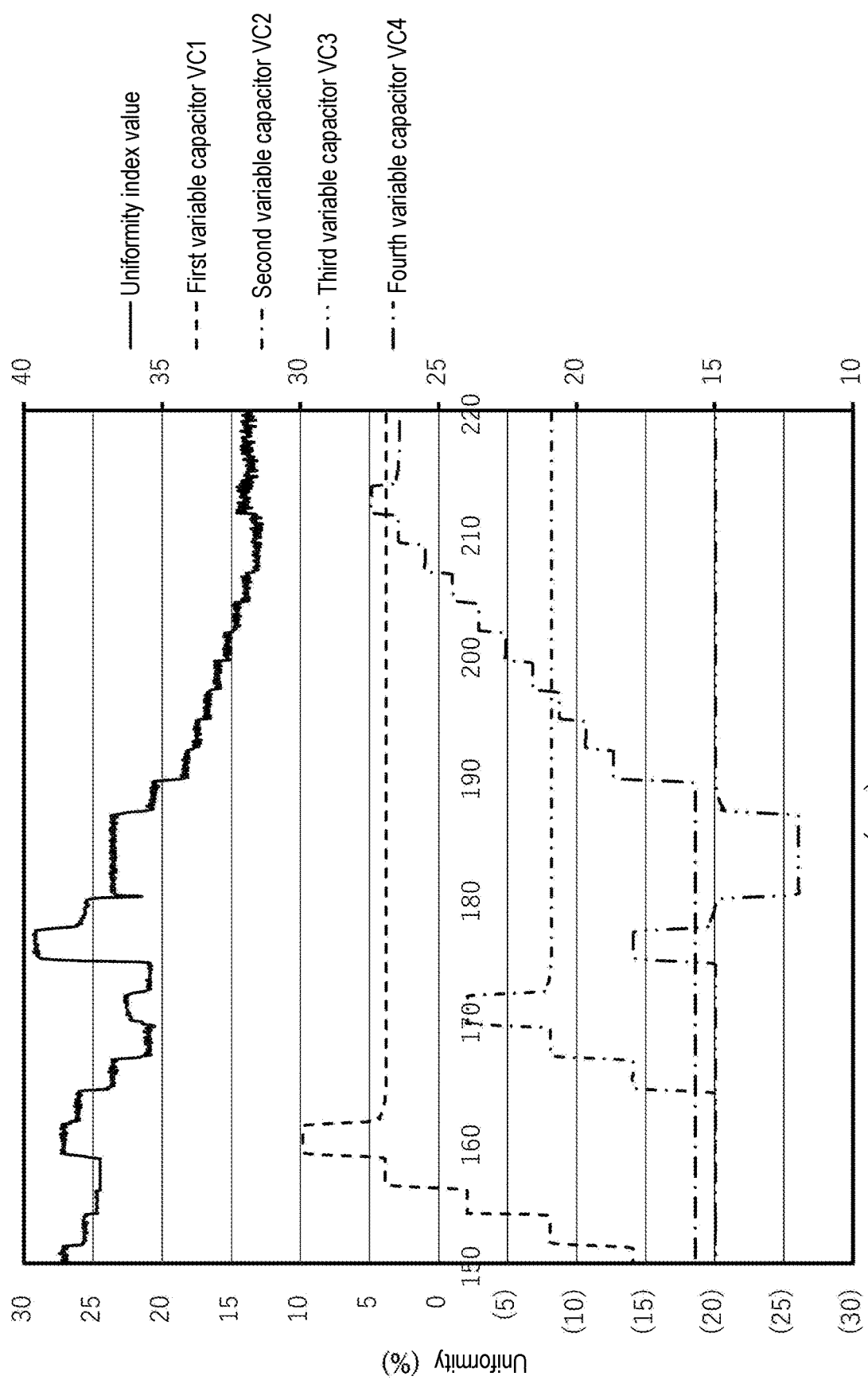
FIG. 11 is a graph showing variations of a uniformity index value according to the control device of the same embodiment.

According to the plasma control system 200 of the present embodiment configured in this manner, as shown in FIG. 11, since the capacitances of the plurality of variable capacitors VC, that is, the reactances of the plurality of variable capacitors VC, sequentially change so that the uniformity index value Ix approaches the set value Is, the current flowing through the plurality of antennas 3 can be made as uniform as possible. As a result, it is possible to generate uniform plasma while it is possible to cope with an increase in size of a substrate using the plurality of antennas 3. Here, the example shown in FIG. 11 is a variation of the uniformity index value Ix when the capacitance of the first variable capacitor VC1 to the fourth variable capacitor VC4 changes.

In addition, since it is a control method in which the capacitances of the plurality of variable capacitors VC sequentially change, even if the number of antennas 3 increases or decreases, it is not necessary to greatly change the control method, and plasma can be made uniform in various device configurations according to a simple control method.

In addition, since the current flowing through each of the feeding side and the ground side of the antennas 3 is detected, the current flowing through the antennas 3 can be made as equal as possible, and since the variable capacitor VC is provided on each of the feeding side and the ground side of the antennas 3, the plasma density can be controlled more finely.

In addition, since the antenna 3 can be cooled with the liquid coolant CL, the plasma P can be stably generated. In addition, since the dielectric of the first variable capacitor VC1 is composed of the liquid coolant CL flowing through the antenna 3, it is possible to minimize an unexpected variation in the capacitance while cooling the first variable capacitor VC1.

Other Modified Embodiments

Here, the disclosure is not limited to the above embodiment.

For example, the antenna group of the above embodiment is composed of a total of six antennas obtained by connecting three sets of two antennas connected in series in parallel, but the number of antennas constituting the antenna group is not limited thereto, and the antenna group may include a plurality of antennas, and for example, it may include four antennas obtained by connecting two sets of two antennas connected in series in parallel.

In addition, in the above embodiment, the movable electrode is rotated by a constant angle until the uniformity index value becomes smaller than the set value, but the rotation angle may be changed stepwise.

Specifically, an aspect in which a threshold value different from the set value is set for the uniformity index value and the rotation angle is changed before and after the threshold value is reached, and an aspect in which the rotation angle is changed according to the current reactance of the variable capacitor VC, that is, the current angle of the movable electrode may be exemplified.

As an example of the former aspect, an aspect in which, if the uniformity index value is larger than the set value, when the reactance changing unit compares the uniformity index value with the threshold value and the uniformity index value is larger than the threshold value, the movable electrode is rotated by a predetermined first angle (for example, 3°), and when the uniformity index value is smaller than the threshold value, the movable electrode is rotated by a predetermined second angle (for example, 1°) smaller than the first rotation angle may be exemplified.

With such a configuration, the reactance change amount can be increased until the uniformity index value reaches the threshold value, the reactance change amount can be reduced until the uniformity index value reaches the threshold value and then reaches the set value, and thus the control time can be shortened.

Here, a plurality of threshold values may be provided and the rotation angle may be changed in more stages.

As an example of the latter aspect, an aspect in which, since the change in reactance when the movable electrode is rotated by the same angle is larger when it is on the low angle side than when it is on the high angle side, a boundary angle as a boundary between the low angle side and the high angle side is set may be exemplified. Here, when the uniformity index value is larger than the set value, the reactance changing unit compares the current angle of the movable electrode with the boundary angle, and if the current angle is larger than the boundary angle, the movable electrode is rotated by a predetermined first angle (for example, 3°), and if the current angle is smaller than the boundary angle, the movable electrode is rotated by a predetermined second angle (for example, 1°) smaller than the first angle.

With such a configuration, the reactance change amount can be adjusted appropriately depending on whether the reactance of the variable capacitor can be changed slowly or the reactance varies greatly.

Here, a plurality of boundary angles may be provided, and the rotation angle may be changed in more stages.

Figure 12:
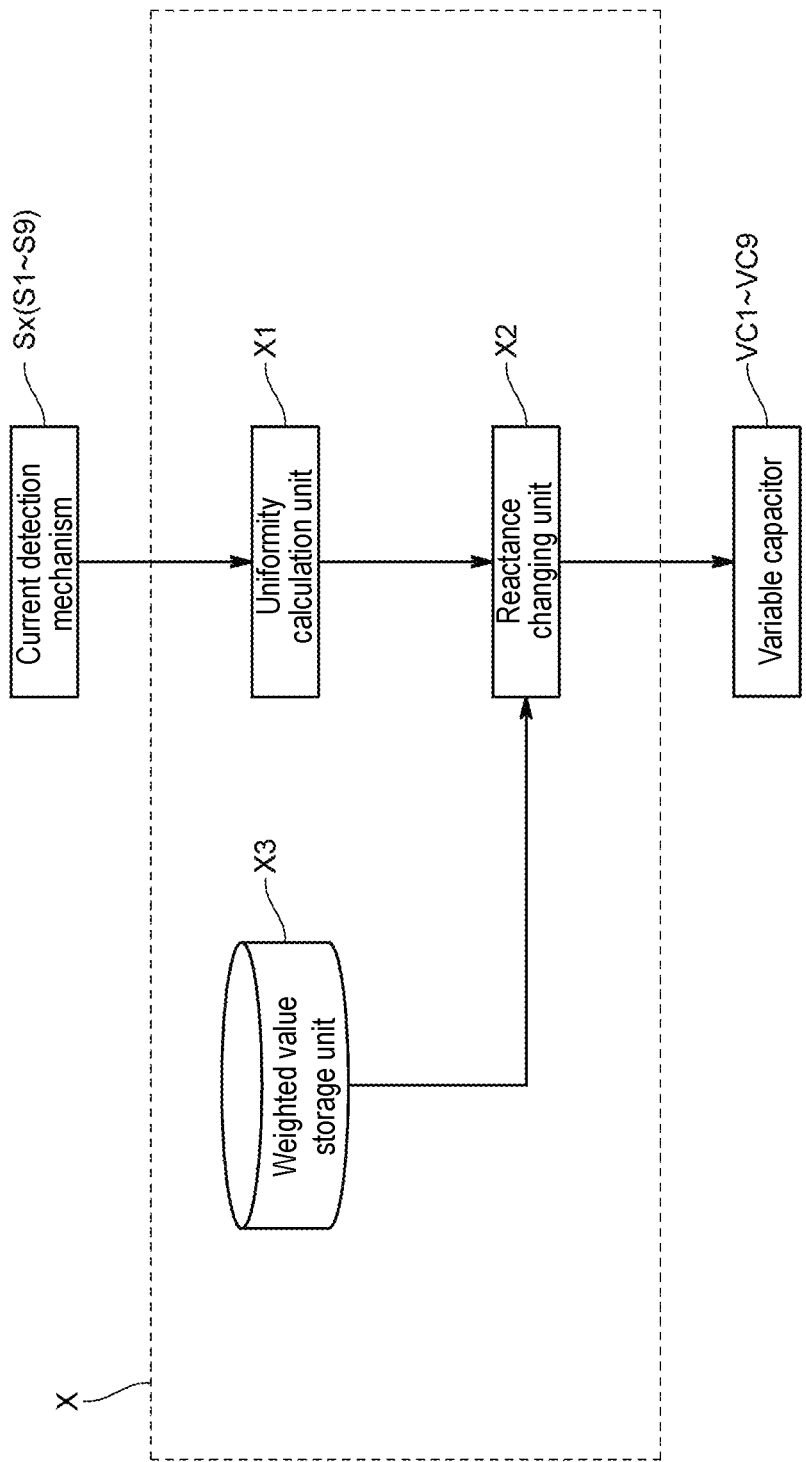
FIG. 12 is a functional block diagram showing functions of a control device according to another embodiment.

In addition, as shown in FIG. 12, the control device X may further include a function of a weighted value storage unit X3 that stores a weighted value indicating the degree of influence on the uniformity index value, which is a value weighted in advance for each of the plurality of variable capacitors.

For such a weighted value, for example, a plurality of variable capacitors are rotated one by one in the forward rotation direction and/or reverse rotation direction by a constant angle, the amount of change (amount of decrease) in the uniformity index value due to the rotation is confirmed, and the weighted value is set to be larger as the amount in change is larger. Here, the weighted value is not limited thereto and may be set by various methods.

Here, when the uniformity index value is larger than the set value, the reactance changing unit X2 refers to the weighted value of each reactance variable element stored in the weighted value storage unit X3, and changes the reactance in the order from the variable capacitor having a larger weighted value.

With such a configuration, since the reactance of the variable capacitor, which has a high influence on the uniformity index value, can be changed, the efficiency of control can be improved.

In addition, in the above embodiment, variable capacitors are provided on the feeding side and the ground side of the antennas, but it is not always necessary to provide all of these variable capacitors, and for example, one or two among the first variable capacitor, the fourth variable capacitor, and the seventh variable capacitor in the above embodiment may be omitted.

In the variable capacitor of the above embodiment, the movable electrode rotates around the rotation axis, but the movable electrode may slide and move in one direction. Here, in a configuration in which the movable electrode slides, the movable electrode may slide in a direction orthogonal to the facing direction with respect to the fixed electrode and the facing area may change, or the movable electrode may slide in a direction facing the fixed electrode and the facing distance may change.

In such a configuration, the drive unit may be a motor as in the above embodiment or a cylinder or the like.

In place of the variable capacitor in the above embodiment, a reactance variable element of which the reactance changes when the movable element moves such as a variable impedance element or a variable resistive element may be used.

In the above embodiment, the antenna has a linear shape, but it may have a curved or bent shape. In this case, the metal pipe may have a curved or bent shape, and the insulating pipe may have a curved or bent shape.

In addition, it should be noted that the disclosure is not limited to the above embodiment, and various modifications can be made without departing from the spirit and scope of the disclosure.

REFERENCE SIGNS LIST

200 Plasma control system
100 Plasma treatment device
W Substrate
P Inductively coupled plasma
IR High-frequency current
2 Vacuum container
3x Antenna group
3 Antenna
3a1 One end
3a2 Other end
VC Variable capacitor
18 Movable electrode (movable element)
CL Liquid coolant (dielectric of liquid)
Sx Current detection mechanism
X Control device
X1 Uniformity calculation unit
X2 Reactance changing unit

What is claimed is:
1. A plasma control system, comprising:
a high-frequency power supply;
an antenna group, comprising a plurality of antennas connected to the high-frequency power supply;
a plurality of reactance variable elements, connected to a feeding side and a ground side of the plurality of antennas;
a current detection mechanism, detecting a current flowing through the feeding side and the ground side of the plurality of antennas;
a uniformity calculation unit, calculating a uniformity index value of the current flowing through the plurality of antennas based on a current value detected by the current detection mechanism; and a reactance changing unit, changing the reactances of the plurality of reactance variable elements in a predetermined order so that the uniformity index value calculated by the uniformity calculation unit approaches a predetermined set value.

2. The plasma control system according to claim 1, wherein the antenna group comprising:
at least two of a first antenna and a second antenna, connected to the high-frequency power supply and connected in series with each other; and
at least two of a third antenna and a fourth antenna, connected to the high-frequency power supply, connected in series with each other, and connected in parallel to the first antenna and the second antenna,
wherein the reactance variable element is provided on a feeding side of the first antenna, between the first antenna and the second antenna, on a ground side of the second antenna, on a feeding side of the third antenna, between the third antenna and the fourth antenna, and on a ground side of the fourth antenna, and
wherein the current detection mechanism detects a current flowing through the feeding side of the first antenna, between the first antenna and the second antenna, the ground side of the second antenna, the feeding side of the third antenna, between the third antenna and the fourth antenna, and the ground side of the fourth antenna.

3. The plasma control system according to claim 2, wherein the uniformity calculation unit calculates the uniformity index value using a maximum value and a minimum value of the current value detected by the current detection mechanism as parameters.

4. The plasma control system according to claim 2, wherein, when the reactance changing unit changes the reactance of the reactance variable element and the uniformity index value is away from the set value, the reactance of the reactance variable element is returned to the reactance before the change, and the reactance of the next reactance variable element changes.

5. The plasma control system according to claim 2, wherein the reactance changing unit compares a threshold value different from the set value with the uniformity index value and makes a reactance change amount different between when the uniformity index value is larger than the threshold value and when the uniformity index value is smaller than the threshold value.

6. The plasma control system according to claim 2, wherein the reactance changing unit makes the reactance change amount different according to a current reactance of the reactance variable element.

7. The plasma control system according to claim 2, further comprising
a weighted value storage unit, the weighted value storage unit stores a weighted value indicating the degree of influence on the uniformity index value, which is a value weighted in advance for each of the plurality of reactance variable elements,
wherein the reactance changing unit changes the reactances of the plurality of reactance variable elements in the order from those having a larger weighted value.

8. The plasma control system according to claim 1, wherein the uniformity calculation unit calculates the uniformity index value using a maximum value and a minimum value of the current value detected by the current detection mechanism as parameters.

9. The plasma control system according to claim 1, wherein, when the reactance changing unit changes the reactance of the reactance variable element and the uniformity index value is away from the set value, the reactance of the reactance variable element is returned to the reactance before the change, and the reactance of the next reactance variable element changes.

10. The plasma control system according to claim 1, wherein the reactance changing unit compares a threshold value different from the set value with the uniformity index value and makes a reactance change amount different between when the uniformity index value is larger than the threshold value and when the uniformity index value is smaller than the threshold value.

11. The plasma control system according to claim 1, wherein the reactance changing unit makes the reactance change amount different according to a current reactance of the reactance variable element.

12. The plasma control system according to claim 1, further comprising
a weighted value storage unit, the weighted value storage unit stores a weighted value indicating the degree of influence on the uniformity index value, which is a value weighted in advance for each of the plurality of reactance variable elements,
wherein the reactance changing unit changes the reactances of the plurality of reactance variable elements in the order from those having a larger weighted value.

13. A plasma control program which is a program used in a plasma control system including a high-frequency power supply, an antenna group comprising a plurality of antennas connected to the high-frequency power supply, a plurality of reactance variable elements connected to a feeding side and a ground side of the plurality of antennas constituting the antenna group, and a current detection mechanism that detects a current flowing through the feeding side and the ground side of the plurality of antennas constituting the antenna group,
wherein the program allows a computer to function as a uniformity calculation unit that calculates a uniformity index value of the current flowing through the plurality of antennas based on a current value detected by the current detection mechanism and a reactance changing unit that changes the reactances of the plurality of reactance variable elements in a predetermined order so that the uniformity index value calculated by the uniformity calculation unit approaches a predetermined set value.

* * * * *